United States Patent
Law et al.

(10) Patent No.: US 6,411,226 B1
(45) Date of Patent: Jun. 25, 2002

(54) HUFFMAN DECODER WITH REDUCED MEMORY SIZE

(75) Inventors: Kwok Wah Law, Tin Shui Wai; Ka Chun Kenneth Lee, Shatin, both of (HK)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/765,192

(22) Filed: Jan. 16, 2001

(51) Int. Cl.[7] ............................................. H03M 7/40
(52) U.S. Cl. ........................................ 341/65; 341/67
(58) Field of Search ................................... 341/65, 67

(56) References Cited

U.S. PATENT DOCUMENTS

| | | | | |
|---|---|---|---|---|
| 5,173,695 A | * | 12/1992 | Sun et al. ..................... 341/67 |
| 5,455,578 A | * | 10/1995 | Bhandari ...................... 341/51 |
| 5,467,088 A | * | 11/1995 | Kimouchi et al. ............. 341/65 |
| 5,481,364 A | * | 1/1996 | Ito ............................ 358/261.1 |
| 5,491,480 A | * | 2/1996 | Jan et al. ....................... 341/67 |
| 5,617,089 A | * | 4/1997 | Kimouchi et al. ............. 341/65 |
| 5,650,905 A | * | 7/1997 | Bakhmutsky ................. 341/67 |
| 5,808,570 A | * | 9/1998 | Bakhmutsky ................. 341/65 |
| 5,973,626 A | * | 10/1999 | Berger et al. ................. 341/65 |
| 6,188,797 B1 | * | 2/2001 | Moledina et al. ........... 382/246 |
| 6,195,026 B1 | * | 2/2001 | Acharya ...................... 341/60 |

\* cited by examiner

Primary Examiner—Michael Tokar
Assistant Examiner—Khai M. Nguyen
(74) Attorney, Agent, or Firm—Lanny L. Parker; Mark J. Fink

(57) ABSTRACT

In a Huffman decoder, a data structure for storing Huffman codes includes a first field for storing a 0-way code and a second field for storing a 1-way code. A first flag is associated with the first field and indicates whether the first field stores an index adjustment or a Huffman code result. A second flag is associated with the second field and indicates whether the second field stores an index adjustment or a Huffman code result.

3 Claims, 5 Drawing Sheets

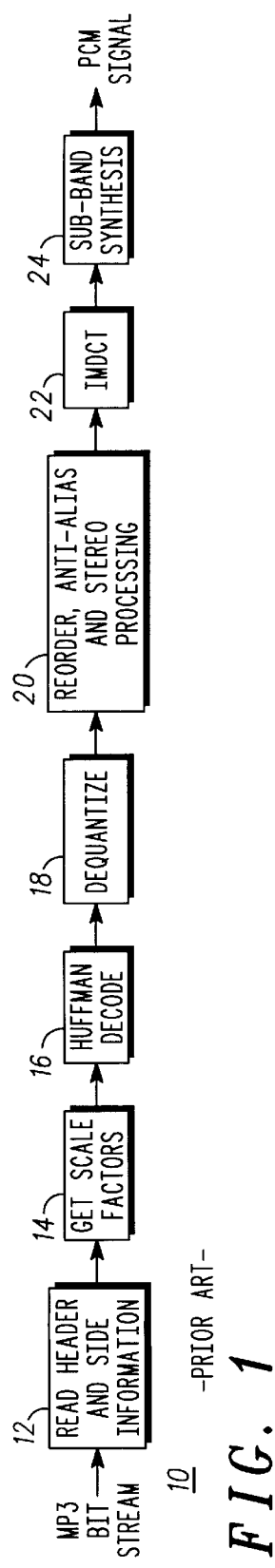
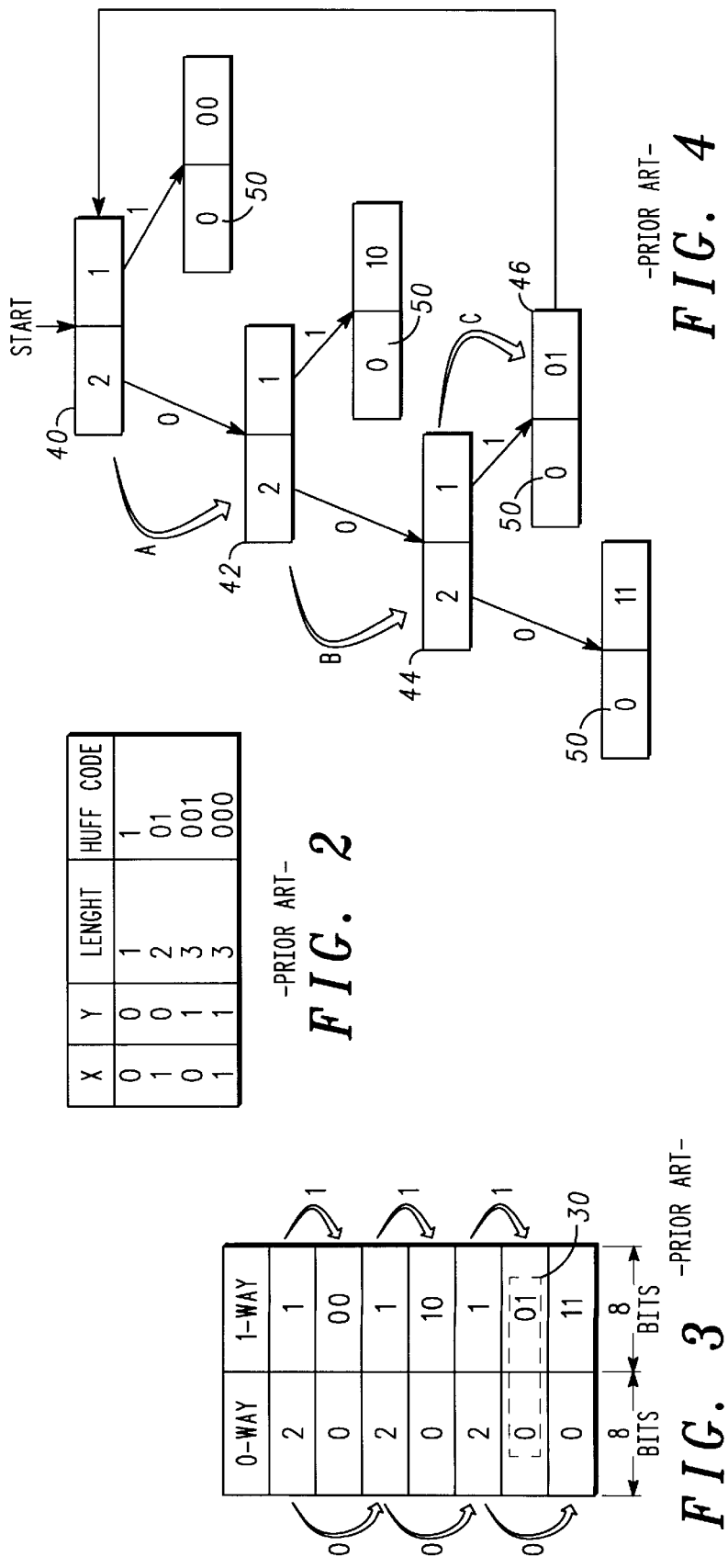

| 0-WAY | 1-WAY | F0 | F1 |
|---|---|---|---|
| 1 | 00 | 0 | 1 |
| 2 | 1 | 0 | 0 |
| 01 | 10 | 1 | 1 |
| 1 | 11 | 0 | 1 |
| 2 | 1 | 0 | 0 |
| 21 | 20 | 1 | 1 |
| 1 | 12 | 0 | 1 |
| 22 | 02 | 1 | 1 |

```
REPEAT {
    IF INPUT BIT=0 {
        CHECK "0-WAY" FLAG.
        IF ("0-WAY" FLAG=0){CHANGE STATE: NEW INDEX=INDEX+1+"0-WAY" CODE
        (INDEX ADJUSTMENT)}
        ELSE {OUTPUT "0-WAY" CODE AS DECODER OUTPUT, FSM TERMINATE}
    } ELSE IF INPUT BIT=1 {
        CHECK "1-WAY" FLAG.
        IF ("1-WAY" FLAG=0){CHANGE STATE: NEW INDEX=INDEX+1}
        ELSE {OUTPUT "1-WAY" CODE (i.e. THE NEXT BYTE IN TABLE) AS DECODER
        OUTPUT, FSM TERMINATE}
    }
}
```

US 6,411,226 B1

HUFFMAN DECODER WITH REDUCED MEMORY SIZE

BACKGROUND OF THE INVENTION

The present invention relates to decoders and more particularly to a Huffman decoder having a reduced memory size and a method of decoding a Huffman encoded bitstream.

Audio and video files, before being compressed, typically consist of 16 bit samples recorded at a sampling rate more than twice the actual audio bandwidth (e.g., 44.1 kHz for Compact Disks), which yields more than 1.4 Mbit to represent just one second of stereo music in CD quality. Since such vast amounts of data are unwieldy, data compression is required.

MPEG (Motion Picture Experts Group) provides standards for compressing digital audio and video signals. MP3 (MPEG Layer 3) is the MPEG layer 3 audio standard. Using MPEG audio coding, the original sound data can be reduced by a factor of 12, without sacrificing sound quality. Recently MP3 audio files have become very popular and as a result, MP3 has become the de facto standard for storing audio files, with many MP3 files available on the Internet and many programs that support the MP3 standard.

FIG. 1 is a schematic block diagram of a conventional MP3 decoder 10. The decoder 10 receives an encoded MP3 bit stream and converts it to an analog audio output signal that is a single PCM coded signal that sounds identical to the original audio signal. More specifically, the MP3 bit stream is a sequence of many frames, each containing a header, error checking bits, miscellaneous information, and encoded data.

At block 12, the MP3 bit stream is received and upon detection of a sync-word indicating the start of a frame, the decoder 10 identifies the header and side information. Next, at block 14, the decoder 10 obtains scale factors. Then, the decoder 10 must decode the samples, which are coded using Huffman codes, at block 16. Huffman coding uses different length bit patterns to encode different pieces of data. The patterns that occur most often are given the shortest bit patterns, while the patterns that occur less frequently are given longer bit patterns. For example, encoding 8-bit bytes with Huffman coding provides many Huffman codes that are less than 8 bits in length, and probably some that are more than 8 bits. Huffman coding can pack audio data very efficiently. Further, Huffman coding is lossless because no noise is added to the audio signal.

Referring to FIG. 2, one method of Huffman decoding is to compare the Huffman coded word with entries in a lookup table until a matching bit pattern is detected. Each Huffman table can contain as many as 256 entries. FIG. 2 shows a table for illustrating the Huffman decode process. The x and y columns represent a bit pattern, the column labeled "Huff code" shows the corresponding Huffman code, and the length column indicates the length of the corresponding Huffman code. This method of Huffman decoding produces a wide variation in decoding time. For example, in a best case, if the codeword matches the first entry, only one search is required. However, if the codeword matches the last entry, if the table has 256 entries, 256 compares are performed.

Another known method of performing Huffman decoding is through the use of a finite state machine, which reduces the code word search time. Initially, the state machine is in a ready/start state. In this state, the index is zero (0). According to the state machine, each time a bit is read, the machine changes state according to the bit read. FIG. 3 shows two one-dimensional arrays, storing "0-way" and "1-way" data for illustrating such a Huffman decode process. The 0-way stores an index adjustment or relative state when the Huffman bit is zero (0). The 1-way stores the index adjustment when the Huffman bit is one (1). The state changes if bit '0' or bit '1' is input. The new 0-way value is checked immediately after a state change. If the 0-way value is '0', the value in the 1-way is the result. The value in 1-way is returned and the state machine returns to the ready state. If the 0-way value is non-zero, the state machine waits for the next input bit and then changes state accordingly.

For example, looking at the row encircled and indicated at 30, if the 0-way entry is '0', the corresponding value in 1-way is the final decoded value, which in this case is the decoded 8-bit value represented by '01', where the upper 4-bits (X) are '0' and the lower 4-bits (Y) are '0001'. The ready/start state is returned to after a code word is successfully decoded.

Referring to FIG. 3 and FIG. 4, an example of when the Huffman codeword is '001' will be discussed. FIG. 4 is a graphical view of the arrays of FIG. 3 being processed by the state machine. At the initial state 40, the first code word bit read is '0', so the state machine proceeds to state 42, as indicated by arrow A. At state 42, the next code word bit is '0', so the state machine proceeds to state 44, as indicated by arrow B. The next code word bit is '1', so the state machine proceeds to state 46, as shown by arrow C. At state 46, since the 0-way value is '0', the actual coded value is determined to be '01' and this value is output by the state machine. Upon completion, the state machine returns to the initial state 40.

The state machine implementation reduces the average search and also the large variation between searches. The number of state changes is equal to the length of the Huffman code. Thus, for a Huffman code that is no more than 16 bits, the best case is one state change and the worst case is sixteen state changes. Therefore, the search time is close to optimal. Further, the memory size for a table, usually maintained in ROM, is only 5546 bytes.

Referring again to FIG. 1, after a bit pattern is decoded, it is dequantized at block 18 using a non-linear dequantization equation, and at block 20, reorder, anti-alias and stereo processing are performed on the samples. Next, at block 22, an Inverse Modified Discrete Cosine Transform (IMDCT) is performed on the frequency domain samples. Finally, at block 24, sub-band synthesis is performed to transform the sub-band samples to the PCM audio signal.

As previously discussed, the Huffman codes are predefined in large tables or in state machine implementations, with a 5 k byte table. While large tables are readily formed without concern for the amount of memory used by MP3 players implemented on personal computers, with the increase in the popularity of MP3 files for storing music, there has been a corresponding increase in the demand for stand-alone MP3 devices and other, smaller portable devices, such as mobile telephones and personal digital assistants (PDAs) capable of playing MP3 encoded music. It would be beneficial if this memory requirement could be reduced for portable devices.

SUMMARY OF THE INVENTION

In order to provide more efficient processing operation, the present invention provides a data structure for storing Huffman codes. The data structure has a first field for storing a 0-way code and a second field for storing a 1-way code. A first flag is associated with the first field and indicates whether the first field stores an index adjustment or a Huffman code result. A second flag is associated with the second field and indicates whether the second field stores an index adjustment or a Huffman code result.

The present invention further provides a method of decoding a Huffman encoded bitstream including the steps of selecting one of a first flag and a second flag based on a value of a first bit of said bitstream and then analyzing a value of the selected flag. If the selected flag has a first value, then a code stored in a node corresponding to the selected flag represents an index adjustment and if the selected flag has a second value, then the code stored in the node corresponding to the selected flag represents a resultant Huffman code value. These steps are repeated on the bits of the bitstream until a flag having the second value is obtained.

The present invention also provides a variable length data structure for a Huffman decoder. The variable length data structure includes a first field for storing a 0-way value, a second field for storing a first flag and a third field for storing a second flag. The first flag is associated with the first field and indicates whether the first field stores a 0-way index adjustment or a 0-way Huffman code result. The second flag is associated with a 1-way value. When the second flag has a first value, the 1-way value is an index adjustment having a value of 1, which is implicit. When the second flag has a second value, then the data structure includes a fourth field for storing the Huffman code value associate with the 1-way value.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings:

FIG. 1 is a schematic block diagram of a conventional Huffman decoder;

FIG. 2 is a conventional Huffman lookup table;

FIG. 3 shows two one-dimensional arrays for illustrating a state machine implementation of the Huffman decode process;

FIG. 4 is a graphical view of the arrays of FIG. 3 being processed by a state machine;

DETAILED DESCRIPTION OF PREFERRED EMBODIMENTS

Figure 5A:
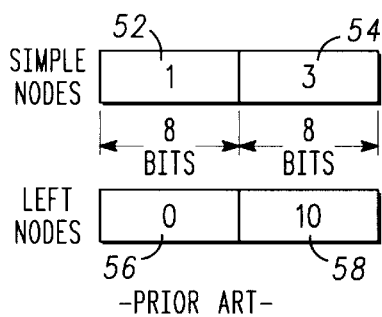
FIG. 5(a) is a schematic diagram showing a conventional node structure.

In the drawings, like numerals are used to indicate like elements throughout.

The present invention provides a Huffman decoder that requires very little memory for storing Huffman code lookup tables. Referring again to FIG. 4, it can be seen that the leaf nodes 50, that is those nodes having no descendent and store a result, use more memory space than necessary for their purpose. The leaf nodes 50 use a whole byte to indicate whether it is a leaf node when actually only one bit is sufficient. Since the total number of leaf nodes 50 is about one-half the total number of nodes, the amount of memory consumed is significant.

Referring now to FIG. 5(a), a conventional state machine uses simple nodes consisting of a one byte 0-way code 52 and a one byte 1-way code 54. The 0-way code 52 stores an index adjustment when a "0" bit is input. The 1-way code 54 stores an index adjustment when a "1" bit is input. When the 0-way index adjustment is "0", as shown at 56, the node is a leaf node. When the node is a leaf node, the 1-way byte of the node stores the Huffman code, in this example, the 1-way byte 58 has a value of "10". The total size of the node including 0-way and 1-way is two bytes or 16 bits.

Figure 5B:
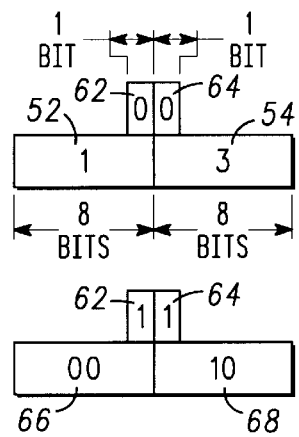
FIG. 5(b) is a schematic diagram showing a node structure in accordance with a first embodiment of the present invention.

Referring now to FIG. 5(b), a node structure 60 in accordance with a first embodiment of the present invention is shown. The node structure 60 includes both the one byte 0-way code 52 and the one byte 1-way code 54. However, the node structure 60 also includes two flag bits 62, 64. The flag bit 62 is associated with the 0-way code 52 and the flag bit 64 is associated with the 1-way code 54. The flag bits 62, 64 are used to indicate whether the corresponding code 52, 54 is an index adjustment or the resultant Huffman code. That is, the flag bits 62, 64 perform the function of the leaf node. When the flag bits 62, 64 have a value of "0" then the corresponding code 52, 54 stores an index adjustment value. When the flag bits 62, 64 have a value of "1" then the corresponding code stores the resultant Huffman code.

For example, as shown in FIG. 5(b), when the flag bit 62 has a value of "1", the value "00" stored in the corresponding code field 66 is the resultant Huffman code value and when the flag bit 64 has a value of "1", the value "10" stored in the corresponding code field 68 is the resultant Huffman code value. Accordingly, although the data structure includes two one byte fields and two flags, for a total of 18 bits, as opposed to 16 bits in the prior art data structure, the present invention reduces the depth of the Huffman tree by one level. Therefore, only 1 bit, as opposed to 1 byte, is used to represent a leaf node. Thus, the total memory usage is reduced.

Figure 6A:
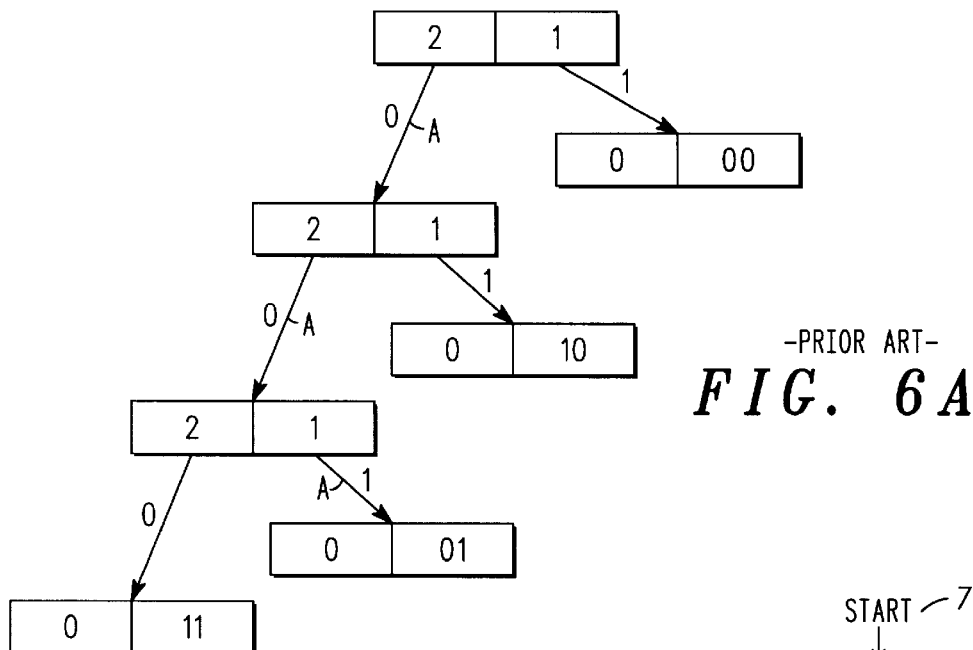
FIG. 6(a) is a graphical view of the array of FIG. 3 being processed by a state machine in a conventional manner and FIG. 6(b) is a graphical view of the array of FIG. 3 being processed by a state machine in accordance with the first embodiment of the present invention.
Figure 6B:
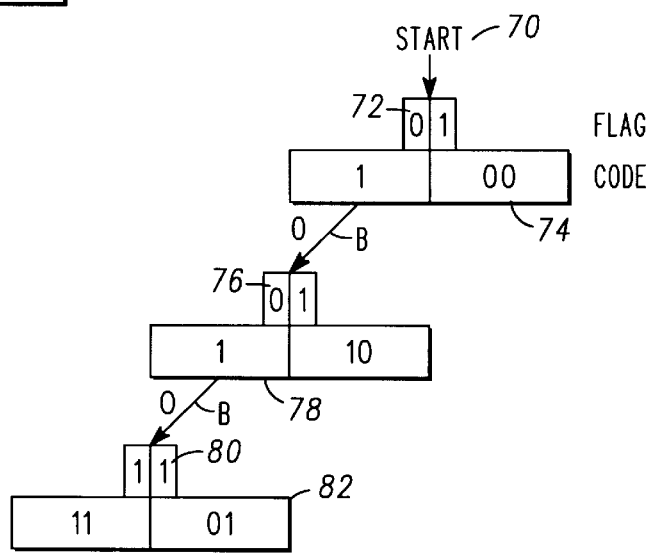

Referring now to FIGS. 6(a) and 6(b), a second example of the Huffman decoding process in accordance with the first embodiment of the present invention is shown. FIG. 6(a) shows the conventional state machine process and FIG. 6(b) illustrates the state machine process using the data structure of the present invention. In this example, the bitstream being decoded is '001'.

In FIG. 6(a), the state machine follows the path with the arrows labeled A to reach the corresponding Huffman coded value '01'. In FIG. 6(b), the state machine starts from an initial state 70. When a '0' is input, the state machine considers the 0-way flag at 72. Since the flag at 72 has a value of '0', the node 74 is not a leaf node and the code '1' stored at the node 74 is used for adjustment. Next, another '0' is input so the 0-way flag at 76 is considered. Since the flag at 76 has a value of '0', the node 78 is not a leaf node and the value stored at the node 78 is used for adjustment. Next, a '1' is input so the 1-way flag at 80 is considered. The 1-way flag at 80 has a value of '1', so the node 82 is a leaf node and the code '01' represents the output. After the code is determined, the state machine returns to the initial state 70.

Comparing the state machines steps shown in FIGS. 6(a) and 6(b), the conventional state machine includes seven nodes, with each node having two 8-bit bytes, for a total of 112 bits. In contrast, the state machine of the present invention processes only three nodes, each node having two 8-bit bytes and 2flag bits, for a total of 54 bits. Thus, it is apparent that the present invention is able to save a significant amount of memory space, in this example, about 52%. Further, only two jump instructions are required to reach the result.

In a presently preferred embodiment, 1 byte is 8 bits and there are 2 flag bits per node, so the flags of 4 nodes are packed together. An index for the flag bit is then calculated using an index of the node.

According to the invention, whenever a bit of the bitstream is input to the finite state machine, the state machine either outputs data or changes state, i.e., jumps. Thus, it can be noticed that the predefined Huffman trees used in MP3 decoding have an interesting property in that for a 1-way branch, the jump offset is always 1. Thus, in accordance with a second embodiment of the invention, the table size may be further reduced by omitting the index adjustment for 1-way branches, as discussed in more detail below.

Figures 7A, 7B:
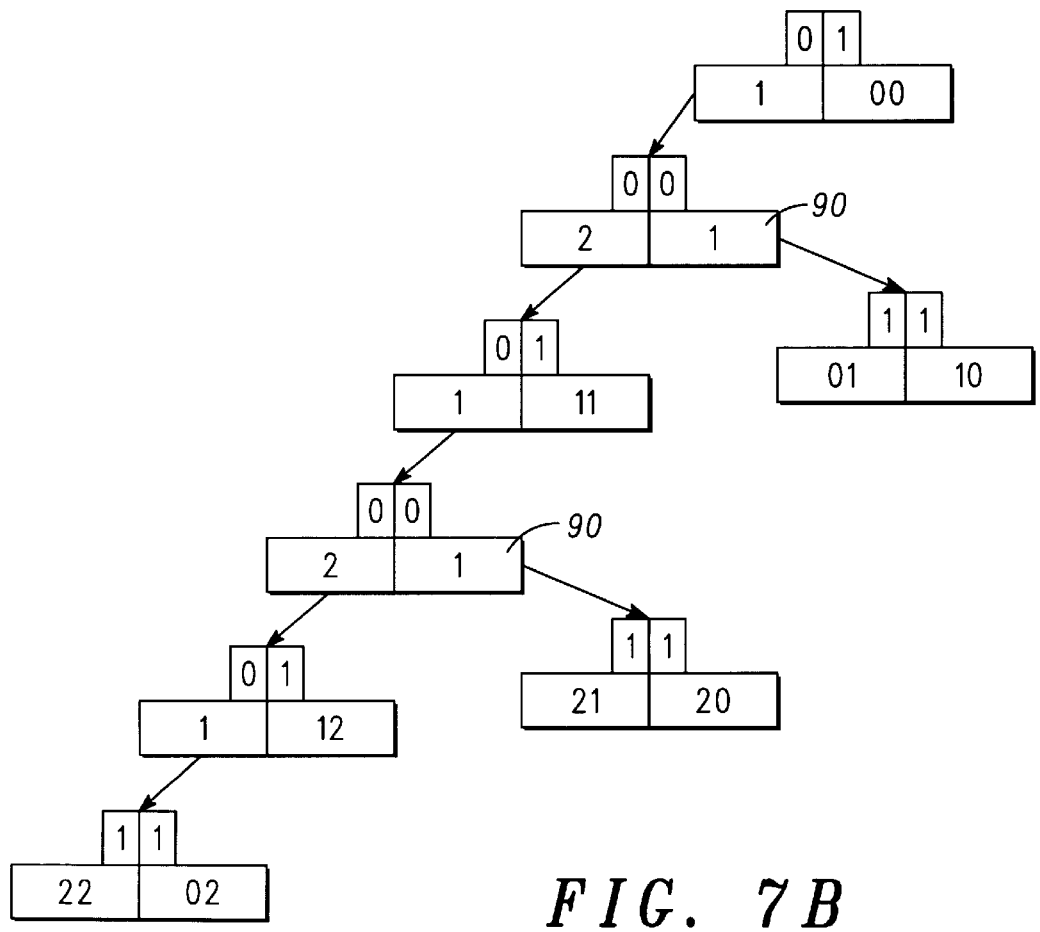
FIG. 7(a) illustrates two one-dimensional arrays for explaining a second example of the Huffman decoding process and FIG. 7(b) is a graphical view of the arrays of FIG. 7(a) being processed by a state machine in accordance with the first embodiment of the present invention.

FIG. 7(a) illustrates two one-dimensional arrays (0-way and 1-way) along with their corresponding flag bits and FIG. 7(b) is a graphical view of the arrays of FIG. 7(a) being processed by a state machine in accordance with the first embodiment of the present invention. As indicated at 90, in the 1-way column, the jump offset is always 1.

Figures 8, 9:
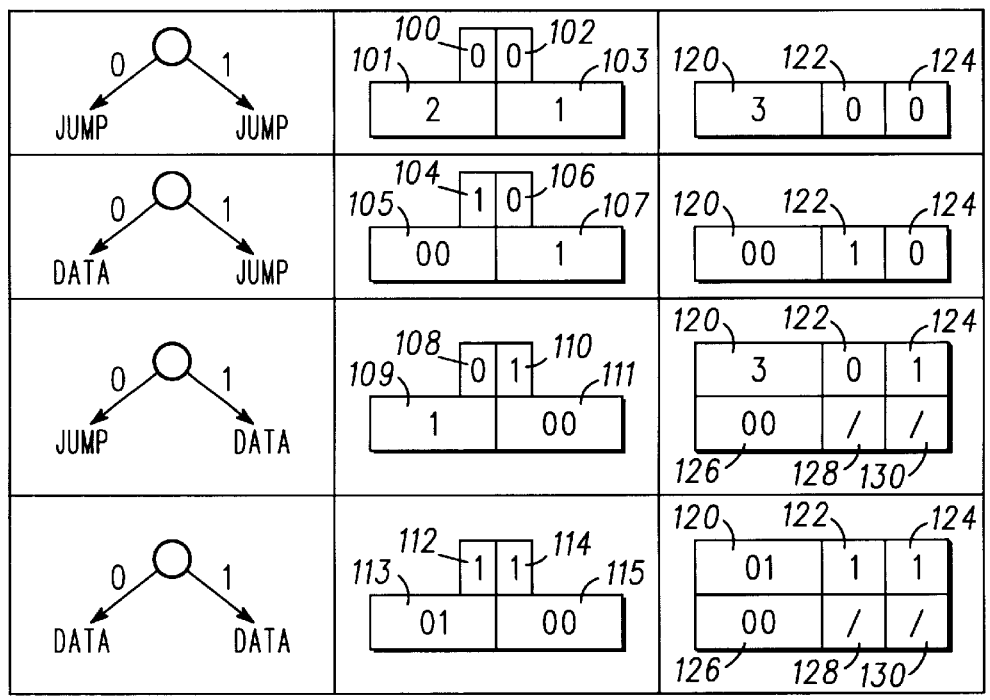
FIG. 8 is a table comparing a node type, a node structure in accordance with the first embodiment of the invention and a variable length node in accordance with a second embodiment of the present invention.
FIG. 9 illustrates pseudo-code for processing a Huffman coded bitstream in accordance with the second embodiment of the present invention.

Referring now to FIG. 8, a table comparing various node types is shown. In column 1, the four nodes shown describe the four different actions that can occur at a node. For example, in row 1, either a 0 or 1 results in a jump, while in row 2, a 0-way branch results in a Huffman code and a 1-way branch results in a jump. Row 3 shows the opposite situation of row 2 and at row 4, either the 0-way branch or the 1-way branch results in data.

Looking now at column 2, the node structure in accordance with the first embodiment of the invention is shown. The node structure corresponds to the node types shown in column 1. At row 1, since both of the flag bits 100, 102 are '0', the data at the corresponding fields 101, 103 are index adjustments. At row 2, the flag 104 for the 0-way branch has a value of '1', which indicates that the corresponding field 105 is a leaf node and the value stored in the field 105 is the Huffman code result. The flag bit 106 is '0' so the data stored at the field 107 is an index adjustment. At row 3, the flag bit 110 has a value of '1', so the corresponding field 111 is a leaf node and the data stored in the field 111 is the Huffman code result '00'. At row 4, both of the flag bits 112, 114 are '1', so both of the corresponding fields 113, 115 are leaf nodes that store Huffman code results. Note that in accordance with the first embodiment of the present invention, the data structures in rows 1–4 of column 2 are all 18 bits, that is, two one bit flags and two corresponding bytes of data.

Referring now to column 3, a variable length node structure in accordance with the second embodiment of the invention is shown. The node has a variable length because the 1-way branch nodes do not have an index adjustment, so the nodes are stored in a variable length format, which in the presently preferred embodiment is either 10 or 20 bits. The nodes shown in column 3 correspond to the nodes of the same row as in columns 1 and 2. The variable length node, in a first form (e.g., col. 3, row 1), includes a first, second and third fields 120, 122, 124. The second and third fields store flag bits and the first field stores either a index adjustment value or data depending on the value of the flag in the second field. In the first form, the first field 120 is 8 bits in length and the second and third fields 122, 124 are each one bit in length.

In a second form (e.g., col. 3, row 3), the variable length node includes the first, second and third fields 120, 122, 124, and also includes fourth, fifth and sixth fields 126, 128, 130. The fourth field 126 stores a data value for a 1-way branch and the fifth and sixth fields 128, 130 are unused. In the presently preferred embodiment, the fourth field 126 is 8 bits in length and the fifth and sixth fields 128, 130 are each one bit in length.

More specifically, when the second field 122 has a value of '0', the first field 120 stores an index adjustment value for a 0-way branch (see rows 1 and 3) and when the second field 122 has a value of '1', the first field 120 stores a data value for a 0-way branch (see rows 2 and 4). When the third field 124 stores a value of '0', it is implicit that the 1-way branch index adjustment value is 1 (rows 1 and 2). When the third field 124 stores a value of '1', then the 1-way branch will provide a data value. As shown at rows 3 and 4, when the third field has a value of '1', the variable node includes the fourth, fifth and sixth fields 126, 128, 130. In this case, the fourth field 126 is used to store a data value for the 1-way branch. As previously discussed, the fifth and sixth fields 128, 130 are presently unused.

FIG. 9 shows a pseudo-code implementation of the state machine for processing a Huffman encoded bitstream in accordance with the second embodiment of the present invention. As can be seen, based on the value of the input bit of the bitstream, either the 0-way flag or 1-way flag is checked and then, action is taken depending on the value of the flag.

Figure 10:
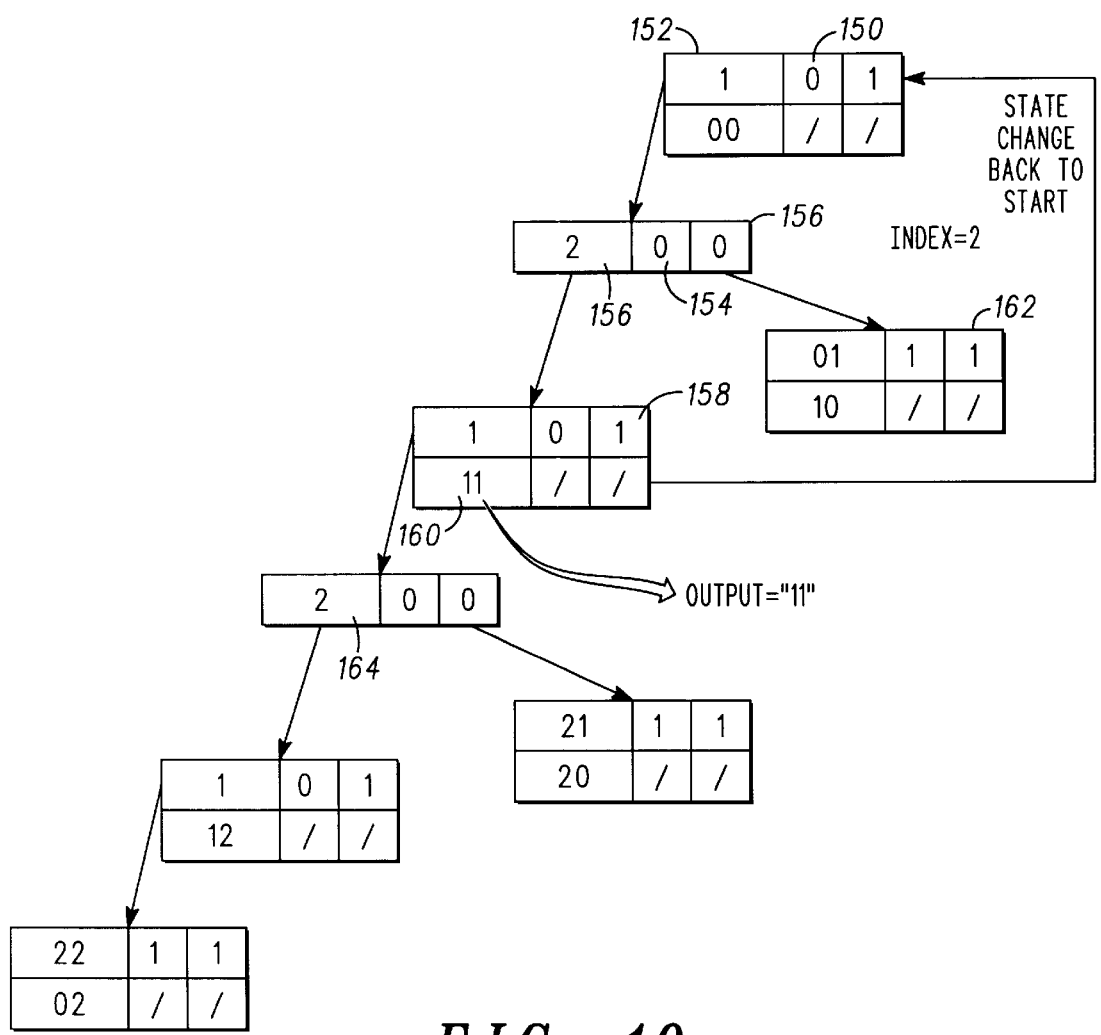
FIG. 10 is a graphical view illustrating the decoding of a Huffman-coded bitstream in accordance with the second embodiment of the present invention.

FIG. 10 is a graphical view illustrating the decoding of a Huffman coded bitstream in accordance with the second embodiment of the present invention. In the example shown, the bitstream input is '001'. At an initial state, the index has a value of 0. The first bit of the bitstream is 0, so the 0-way flag indicated at 150 is checked first. The 0-way flag 150 has a value of 0, so the first field 152 stores a 0-way index adjustment value of 1. Hence, according to the pseudo code shown in FIG. 9, a new index value is calculated as: INDEX=initial index(0)+1+0-way index adjustment(1)=2.

The next bit input is 0, so the 0-way flag indicated at 154 is checked. The 0-way flag 154 has a value of 0, so the first field 156 of the node holds a 0-way index adjustment value of 2. Again, according to the pseudo code shown in FIG. 9, a new index value is calculated as:

INDEX=index (2)+1+0-way index adjustment(2)=5. This index value of '5' is an offset relative to the initial state and is used to locate the first field in the node.

The next bit input is 1, so the 1-way flag indicated at 158 is checked. The 1-way flag 158 has a value of 1, so the node includes a fourth field 160, which holds the resultant Huffman code. In this case, the value stored in the fourth field is '11'. At this point, since the Huffman code value has been determined, the state machine returns the index to the initial value of 0.

The other nodes in FIG. 10 are reached when using other bitstream input values. For example, if the bitstream had a value of '000, the node indicated at 162 would be reached. If the bitstream had a value of '0010' and the flag stored in the third field 158 had a value of 1, the node indicated at 164 would be reached.

As is apparent from the above, the present invention provides data structures for Huffman decoding that require less memory space and allow for efficient state machine execution. While the foregoing discussion describes the invention in terms of one byte code fields, it will be understood by those of ordinary skill in the art that the invention is applicable to other size fields. For example, each code field could be one word in size and the size of a word could vary for instance from 16 bits to 32 or more bits.

It will be appreciated by those skilled in the art that changes could be made to the embodiments described above without departing from the broad inventive concept thereof. For example, although the present invention has been described with reference to an MP3 player, the invention is applicable to other applications that require Huffman decoding, such as printers and JPEG (Joint Photographic Experts Group) imaging systems like desktop video editing, digital still cameras, surveillance systems, video conferencing and other consumer products. It is understood, therefore, that this invention is not limited to the particular embodiments disclosed, but it is intended to cover modifications within the spirit and scope of the present invention as defined by the appended claims.

What is claimed is:

1. In a Huffman decoder, a data structure comprising;

a first field for storing a 0-way value;

a second field for storing a 1-way value;

a first flag associated with the first field, the first flag indicating whether the first field stores a 0-way index adjustment or a 0-way Huffman code result; and a second flag associated with the second field, the second flag indicating whether the second field stores a 1-way index adjustment or a 1-way Huffman code result, wherein the first and second fields are each one byte, the first and second flags are each one bit, the first and second fields are stored together, and the first and second flags associated with four of the first and second fields are stored together.

2. A method of decoding a Huffman encoded bitstream, comprising the steps of:

selecting one of a first flag and a second flag based on a value of a first bit of said bitstream;

analyzing a value of said selected flag, wherein if said selected flag has a first value, then a code stored in a node corresponding to said selected flag represents an index adjustment and if said selected flag has a second value, then said code stored in said node corresponding to said selected flag represents a resultant Huffman code value; and analyzing said bits of said bitstream until said selection step provides said selected flag having said second value, wherein the first and second flags and the corresponding node comprise a data structure.

3. In a Huffman decoder, a variable length data structure comprising:

a first field for storing a 0-way value;

a second field for storing a first flag, the first flag associated with the first field and indicating whether the first field stores a 0-way index adjustment or a 0-way Huffman code result;

a third field for storing a second flag, the second flag associated with a 1-way value, wherein when the second flag has a first value, the 1-way value is an index adjustment having a value of 1; and a fourth field when the second flag has a second value, the fourth field storing a 1-way Huffman code result, wherein the first and fourth fields are each one byte in length and the second and third fields are each one bit in length.

* * * * *